US007087359B2

(12) United States Patent
Deroover et al.

(10) Patent No.: US 7,087,359 B2
(45) Date of Patent: Aug. 8, 2006

(54) HEAT-SENSITIVE LITHOGRAPHIC PRINTING PLATE PRECURSOR

(75) Inventors: Geert Deroover, Leuven (BE); Marc Van Damme, Bonheiden (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/765,797

(22) Filed: Jan. 27, 2004

(65) Prior Publication Data

US 2004/0182268 A1 Sep. 23, 2004

Related U.S. Application Data

(60) Provisional application No. 60/444,470, filed on Feb. 3, 2003.

(30) Foreign Application Priority Data

Jan. 27, 2003 (EP) .................................. 03100154

(51) Int. Cl.
*G03F 7/11* (2006.01)
*B41N 1/14* (2006.01)
*B41N 1/08* (2006.01)

(52) U.S. Cl. ............................... 430/272.1; 430/273.1; 430/271.1; 430/945; 101/463.1; 101/453

(58) Field of Classification Search ............. 430/273.1, 430/271.1, 272.1, 278.1; 101/457, 467
See application file for complete search history.

(56) References Cited

U.S. PATENT DOCUMENTS

| | | | | |
|---|---|---|---|---|
| 4,743,530 A * | 5/1988 | Farid et al. | | 430/281.1 |
| 5,466,557 A | 11/1995 | Haley et al. | | |
| 5,491,046 A | 2/1996 | DeBoer et al. | | |
| 6,040,115 A * | 3/2000 | Bailey et al. | | 430/271.1 |
| 6,455,229 B1 | 9/2002 | Vermeersch et al. | | |
| 2003/0129532 A1* | 7/2003 | Kawauchi et al. | | 430/271.1 |

FOREIGN PATENT DOCUMENTS

| | | | |
|---|---|---|---|
| EP | 0 864 420 | A1 | 9/1998 |
| EP | 1 080 884 | A1 | 3/2001 |
| EP | 1 162 078 | A2 | 12/2001 |
| EP | 1 249 341 | A1 | 10/2002 |
| EP | 1 256 444 | A1 | 11/2002 |
| EP | 1 473 156 | A2 * | 11/2004 |
| WO | WO 97/39894 | A1 | 10/1997 |
| WO | WO 99/21715 | A1 | 5/1999 |
| WO | WO 99/21725 | A1 | 5/1999 |

OTHER PUBLICATIONS

Search Report for EP 03 10 0154 (Jul. 11, 2003).

* cited by examiner

*Primary Examiner*—Cynthia Hamilton
(74) *Attorney, Agent, or Firm*—Leydig, Voit & Mayer, Ltd.

(57) ABSTRACT

A positive working printing plate precursor is disclosed which comprises a hydrophilic support and a coating provided thereon which comprises in the order given a first layer containing an oleophilic resin soluble in an aqueous alkaline developer and a second layer comprising a water repellent-compound. Furthermore, the coating comprises an infrared absorbing dye containing a perfluoroalkyl group providing a printing plate precursor with high sensitivity.

16 Claims, No Drawings

HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/444,470 filed Feb. 3, 2003, which is incorporated by reference. In addition, this application claims the benefit of European Application No. 03100154.8 filed Jan. 27, 2003, which is also incorporated by reference.

FIELD OF THE INVENTION

The present invention relates to a positive working lithographic printing plate precursor that requires aqueous alkaline processing and comprises an infrared absorbing dye containing a perfluoroalkyl group.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors are known. Such materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross-linking of a polymer or by particle coagulation of a thermoplastic polymer latex, and solubilization by the destruction of intermolecular interactions.

U.S. Pat. No. 5,466,557 describes a positive-working printing plate precursor which is sensitive to both ultraviolet (UV) and infrared (IR) light but not to visible light, comprising a support and a coating comprising an oleophilic polymer that is soluble in an aqueous alkaline developer and a latent Bronsted acid.

EP-A 864420 describes a positive-working heat-sensitive printing plate precursor comprising a support, a first layer containing an oleophilic polymer that is soluble in an aqueous alkaline developer and an IR-sensitive top layer of which the penetrability by or solubility in the aqueous alkaline developer is changed upon exposure to IR light.

WO 97/39894 describes a positive-working heat-sensitive printing plate precursor which is sensitive to IR light but not to UV light comprising a support and an IR-sensitive coating comprising an oleophilic polymer that is soluble in an aqueous alkaline developer and a dissolution inhibitor which reduces the solubility of the polymer in the developer.

WO99/21725 and WO99/21715 describe a positive-working heat sensitive printing plate precursor of which the coating comprises a compound which increases the developer resistance thereof. Said compound is selected from the group of poly(alkylene oxide), siloxanes and esters or amides of polyhydric alcohols.

U.S. Pat. No. 5,491,046 describes a method for imaging a positive and/or negative lithographic printing plate precursor wherein the imaging layer comprises a resole resin, a novolac resin, a latent Bronsted acid and an IR absorber. In one of the examples a cyanine dye with a pentafluoropropionate counter ion is described.

EP 1 162 078 describes an image formation material comprising a substrate and an image formation layer on the substrate which contains an infrared absorption dye having at least one surface orientation group as substituent for the purpose of improving sensitivity and or image forming property of the image formation material.

The major problems associated with the prior art materials is (i) the low differentiation between the development kinetics of exposed and non-exposed areas—i.e. the dissolution of the exposed coating in the developer is not completely finished before the unexposed coating also starts dissolving in the developer—and (ii) thermal diffusion of heat into the substrate resulting in a reduced sensitivity of the printing plate precursor. This leads to low quality prints showing unsharp edges and toning (ink-acceptance in exposed areas) and a narrow development latitude.

SUMMARY OF THE INVENTION

It is an object of the present invention to provide a positive-working lithographic printing plate precursor which shows a high differentiation between exposed and non-exposed areas and which has a high sensitivity. These objects are realized by the material described herein.

By providing a water-repellent compound in the second layer of the coating and by the use of infrared absorbing dyes comprising specific substituents which increase the compatibility of the dye with the second layer of the coating the heat created during infrared exposure is concentrated in the second layer.

DETAILED DESCRIPTION OF THE INVENTION

The lithographic printing plate precursor of the present invention contains a support having a hydrophilic surface and a coating provided thereon. The coating comprises at least two layers, designated herein as first and second layer; the first layer being closest to the support, i.e. located between the support and the second layer. The printing plate precursor is positive-working, i.e. after exposure by light and development the exposed areas of the coating are removed from the support and define hydrophilic (non-printing) areas, whereas the unexposed coating is not removed from the support and defines an oleophilic (printing) area. The second layer is believed to act as a barrier that prevents penetration of the aqueous alkaline developer into the oleophilic resin of the first layer at unexposed areas. At exposed areas, the barrier function of the second layer can be reduced due to the exposure and dissolution of the coating at those areas can be increased upon immersion in an aqueous alkaline developer. This reduction of the barrier function of the second layer upon exposure can be tested e.g. by measuring the water uptake, due to swelling of the oleophilic resin, of an exposed and a non-exposed sample: typically, the exposed sample absorbs a small amount of water whereas the average water-uptake of non-exposed samples is within statistical error not different from zero.

The barrier function of the second layer arises from the presence of a water-repellent compound. Suitable examples thereof are polymers comprising siloxane and/or perfluoroalkyl units or block- or graft-copolymers comprising a poly- or oligo(alkylene oxide) block and a block of poly- or oligosiloxane and/or perfluoroalkyl units. The water-repellent polymer may be present in an amount of e.g. between 0.5 and 15 $mg/m^2$, preferably between 0.5 and 10 $mg/m^2$, more preferably between 0.5 and 5 $mg/m^2$ and most preferably between 0.5 and 2 $mg/m^2$. Higher or lower amounts are also suitable, depending on the hydrophobic/oleophobic character of the compound. When the water-repellent polymer is also ink-repelling, higher amounts than 15 $mg/m^2$ can result in poor ink-acceptance of the non-exposed areas. An amount lower than 0.5 $mg/m^2$ on the other hand may lead to an unsatisfactory development latitude: development of the exposed areas is not completed before the start of the development of the non-exposed areas.

The block comprising the siloxane and/or perfluoroalkyl units may be a linear, branched, cyclic or complex cross-linked polymer or copolymer. The perfluoroalkyl unit is e.g. a —$(CF_2)$— unit. The number of such units may be larger than 10, preferably larger than 20. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes, e.g. phenylmethylsiloxanes and dimethylsiloxanes. The number of siloxane groups —Si(R,R')—O— in the (co-) polymer is at least 2, preferably at least 10, more preferably at least 20. It may be less than 100, preferably less than 60. The alkylene block preferably includes units of the formula —$C_nH_{2n}$—O— wherein n is preferably an integer in the range 2 to 5. The moiety —$C_nH_{2n}$— may include straight or branched chains. The alkylene moiety may also comprise optional substituents. Preferred embodiments and explicit examples of such polymers have been disclosed in WO99/21725. A suitable water-repellent polysiloxane compound is preferably a random or block-copolymer comprising siloxane and alkyleneoxide groups, suitably comprising about 15 to 25 siloxane units and 50 to 70 alkyleneoxide groups. Preferred polysiloxanes include a copolymer of dimethyldichlorosilane, ethylene oxide and propylene oxide. Specific compounds are the following:

(I)

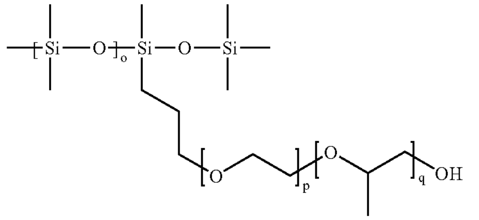

(II)

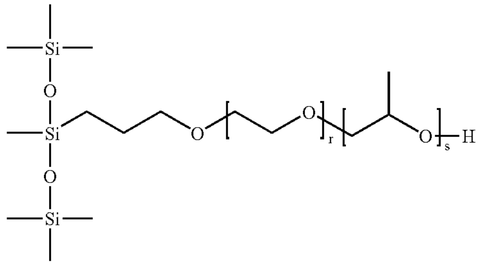

wherein o, p, q, r and s are integers >1.

In formula I, a poly(alkylene oxide) block consisting of ethylene oxide and propylene oxide units is grafted to a polysiloxane block. In formula II, long chain alcohols consisting of ethylene oxide and propylene oxide units are grafted to a trisiloxane group.

The second layer may contain the oleophilic resin as well as the water-repellent compound. However, it is believed that block- or graft-copolymers comprising a poly- or oligo (alkylene oxide) block and a block of poly- or oligosiloxane and/or perfluoroalkyl units due to their bifunctional structure, position themselves during coating at the interface between the coating solution and air and thereby automatically form a separate layer, corresponding to the second layer of the present invention, even when applied as an ingredient of the coating solution of the oleophilic layer.

Alternatively, the water-repellent compound can be applied in a second solution, coated on top of the first layer. In that embodiment, it may be advantageous to use a solvent in the second coating solution that is not capable of dissolving in the ingredients present in the first layer so that a phase of highly concentrated water-repellent polymer is obtained at the top of the material.

Whilst the applicants do not wish to be limited by any theoretical explanation of how their printing plate precursor operates, it is believed that the spreading of the second layer on the first layer is reduced by the exposure, e.g. by 'thermal de-wetting', i.e. heat-induced decrease of the surface tension of the polysiloxane, to such an extent that the second layer breaks up, thereby forming an incomplete layer which can no longer shield the first layer from the developer completely. Rubbing with a cotton pad also removes a sufficient amount of the polysiloxane to trigger development. The removal of the polysiloxane by rubbing can be measured e.g. by comparing the ratio of the siloxane $^1$H-NMR signals versus the signals of the phenolic resin of a sample before and after rubbing.

The oleophilic resin is preferably a polymer that is soluble in an aqueous developer, more preferably an aqueous alkaline developing solution with a pH between 7.5 and 14. Preferred polymers are phenolic resins e.g. novolac, resoles, polyvinyl phenols and carboxy substituted polymers. Typical examples of these polymers are described in DE-A-4007428, DE-A-4027301 and DE-A-4445820.

The coating comprises an IR dye containing a perfluoroalkyl group, which sensitizes the material to the IR light used during the exposure. It is preferably a compound having an absorption maximum in the wavelength range between 750 and 1500 nm, so that a daylight stable material is obtained which can be handled without the need for darkroom conditions. Daylight stable material means that no substantial dissolution in the developer is induced by exposure to visible light.

The sensitizing dye may be present in the first layer, in the second layer discussed above or in an optional other layer. It is believed that the perfluoroalkyl group comprised in the IR light absorbing dye makes the dye more compatible with the water-repellent compound and thereby promotes the tendency of the dye to position itself preferentially in the second layer, i.e. further away from the support. As a result, the heat generated by the exposure is concentrated in the second layer and a high sensitivity is observed. The concentration of the IR absorbing compound in the coating is typically between 0.25 and 10.0 wt. %, more preferably between 0.5 and 7.5 wt. %.

Preferred IR absorbing compounds for use in this invention are represented by the general formula III:

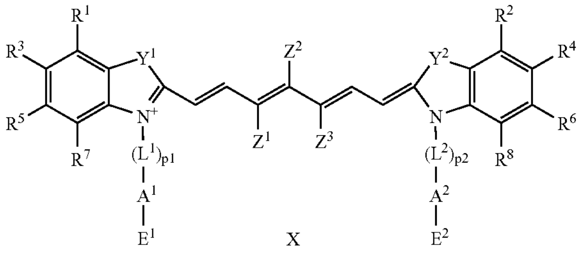

wherein

-$L^1$- and -$L^2$- independently represent a divalent linking group such as alkylene, arylene, heteroarylene, $—(CH_2)_t—O—$, $—(CH_2)_t—NH—$, $—(CH_2)_t—COO—$, $—(CH_2)_t—COO—(CH_2)_u—$, $—(CH_2)_t—OCO—(CH_2)_u—$, $—(CH_2)_t—CONH—$ or $—(CH_2)_t—CONH—SO_2—$, or combinations thereof;

-$E^1$ and -$E^2$ independently represent a neutral, anionic or cationic terminal group selected from alkyl, —OH, —H, —Cl, —Br, —F (neutral groups);

$—SO_3^-$, $—SO_4^-$, $—PO_3^{2-}$, $—PO_4^{2-}$, $—COO^-$ (anionic groups);

$—[NR^aR^bR^c]^+$ (cationic group);

$R^a$, $R^b$ and $R^c$ independently represent a hydrogen atom or an alkyl group;

-$A^1$- and -$A^2$- independently represent $—C_vF_{2v}—$, $—[(CF_2)_2—O]_w—$, a long chain alkylgroup containing at least four carbon atoms or an optionally substituted alkyl, alkenyl, aryl or aralkyl group;

with $p_1$ and $p_2$ are 0 or 1;

with t and u are 1 or an integer greater than 1;

with v and w is 2 or an integer greater than 2;

$—Y^1—$ and $—Y^2—$ independently represent $—CR^9R^{10}—$, —S—, —Se—, $—NR^{11}—$, —CH═CH— or —O—;

$R^1$ to $R^{11}$ each independently represent a hydrogen atom, an optionally substituted alkyl, alkenyl, aryl or aralkyl group or a group selected from a halogen atom, $—NO_2$, $—O—R^d$, $—CO—R^d$, $—CO—O—R^d$, $—O—CO—R^d$, $—CO—NR^dR^e$, $—NR^dR^e$, $—NR^d—CO—R^e$, $—NR^d—CO—O—R^e$, $—NR^d—CO—NR^eR^f$, $—SR^d$, $—SO—R^d$, $—SO_2—R^d$, $—SO_2—O—R^d$, $—SO_2NR^dR^e$ or a perfluoroalkyl group, each of said groups may optionally comprise a terminal group E defined above as -$E^1$ and -$E^2$ and/or wherein two adjacent groups selected from $R^1$, $R^2$, $R^3$, $R^4$, $R^5$, $R^6$, $R^7$, $R^8$, $Y^1$ and $Y^2$ together form an optionally substituted 5- or 6-membered ring; $R^d$, $R^e$ and $R^f$ independently represent a hydrogen or an optionally substituted alkyl, alkenyl, aryl or aralkyl group;

$Z^1$ and $Z^3$ each independently represent a hydrogen atom, an alkylgroup or $Z^1$ and $Z^3$ together represent the necessary atoms to complete an optionally substituted 5- or 6-membered ring;

$Z^2$ represents a substituent selected from a hydrogen atom, an alkyl group, a halogen atom, an amino group, an arylthio group, an alkylthio group, an aryloxy group, an alkoxy group, a barbituric group or a thiobarbituric group, each of said groups being optionally substituted;

X represents one or more optional counter ions selected from: $Cl^-$, $Br^-$, $I^-$, $F^-$, D-$SO_3^-$, D-$SO_4^{2-}$, D-$PO_4^{2-}$, D-$PO_3^{2-}$, D-$COO^-$, D-$[NR^gR^hR^i]^+$, $ClO_4^-$ or $BF_4^-$;

$R^g$, $R^h$ and $R^i$ independently represent a hydrogen atom or an alkyl group;

D represents $C_jF_{2j+1}—$, $CF_3—[(CF_2)_2—O]_i—$, an alkyl group, an aryl group or a substituted aryl group;

with j is 3 or an integer greater than 3;

with i is 1 or an integer greater than 1;

with the proviso that for the general formula III above at least one of the following substituents is represented by a perfluoroalkyl group:

-$A^1$-, -$A^2$-, $R^1$ to $R^{11}$ or X.

In the embodiment wherein the IR light absorbing dye carries a negative or positive charge, a counter ion X with opposite charge is present to neutralize the compound. The dye can be anionic or cationic as the chromophore and/or fluorine containing substituents on the chromophore and/or other substituents on the chromophore can have an electrical charge. The unit of charge of the dye is determined by the sum of the positive and/or negative charges of the substituents on the dye and one or more counter ions with equal sum of opposite charge is present to neutralize the dye. The unit of charge of the counter ions can be mono or multiple and/or positive or negative.

In the embodiment wherein -$E^1$ and -$E^2$ represent a neutral terminal group such as alkyl, —H or —F (and no other charged groups are present on the IR light absorbing dye), a counter ion X carrying a negative charge is present to neutralise the positively charged IR light absorbing dye. If, on the other hand one of the terminal groups is represented by an anionic group such as $—SO_3^-$, $—SO_4^-$, or $—COO^-$ (and the other terminal group is represented by a neutral group and no other charged groups are present on the IR light absorbing dye) no counter ion is required. One of the terminal groups can be a cationic group such as $—[NR^aR^bR^c]^+$, than one counter ion carrying two negative charges (e.g. D-$PO_4^{2-}$, D-$PO_3^{2-}$) or two counter ions each carrying one negative charge (e.g. $Cl^-$, $Br^-$, $I^-$, $F^-$, D-$SO_3^-$, D-$SO_4^-$, D-$COO^-$, $ClO_4^-$ or $BF_4^-$) are present. Depending on the kind of the terminal groups $-E^1$ and $-E^2$ and their unit of charge, none, one or more counter ions are necessary to neutralise the IR light absorbing dye.

In another embodiment wherein $Z^2$ represents a substituent carrying a negative charge, e.g. a negatively charged barbituric group, and no other substituents carrying a positive or negative charge are present on the IR light absorbing dye, a Zwitterion where the sum of charge of the dye is zero is obtained and no counter ion is present.

Negatively charged barbituric group:

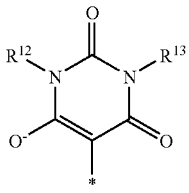

wherein $R^{12}$ and $R^{13}$ independently represent a hydrogen atom, an optionally substituted alkyl, alkenyl, aryl or aralkyl group or a perfluoroalkyl group which may optionally comprise a terminal group E defined above as $-E^1$ and $-E^2$ The negatively charged barbituric group is bonded to the heptamethine group by *.

Prefered subclasses of the above IR light absorbing dyes are represented by the following formulae:

(IV)

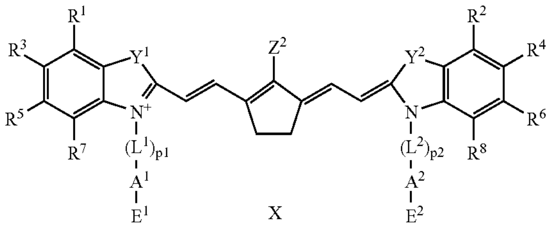

(V)

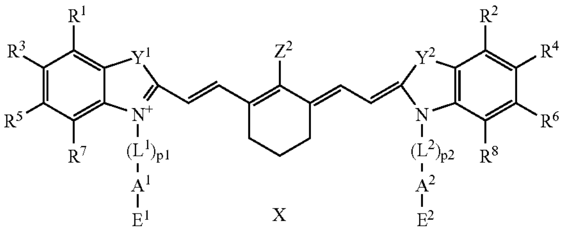

(VI)

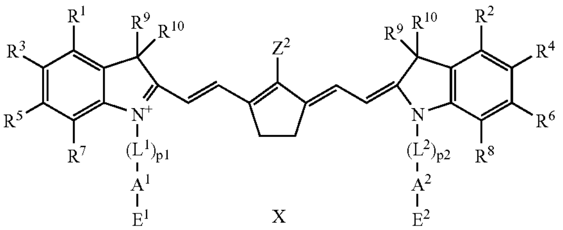

-continued (VII)

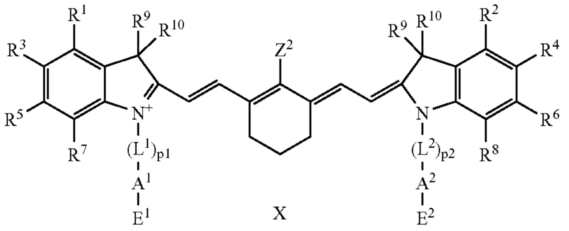

(VIII)

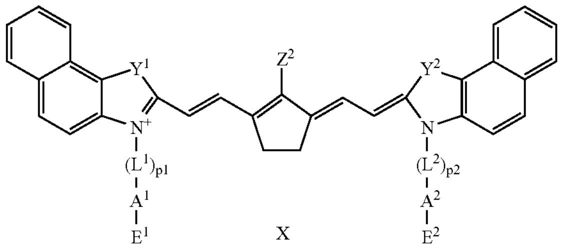

(IX)

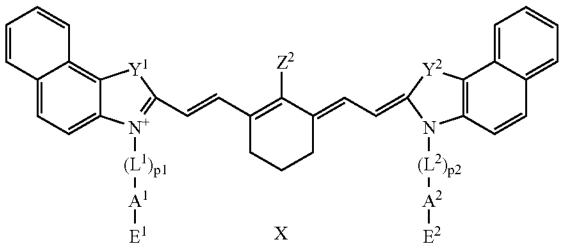

(X)

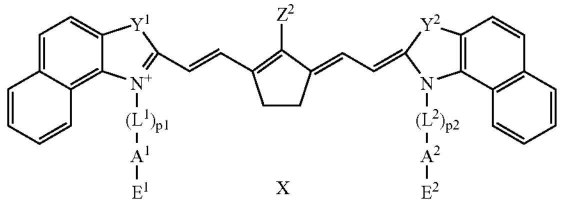

(XI)

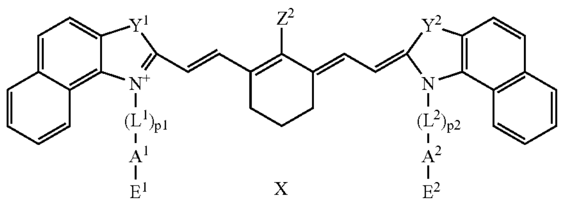

-continued (XII)

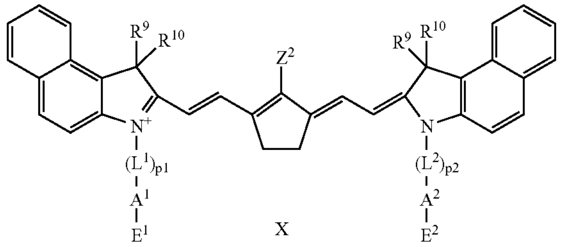

(XIII)

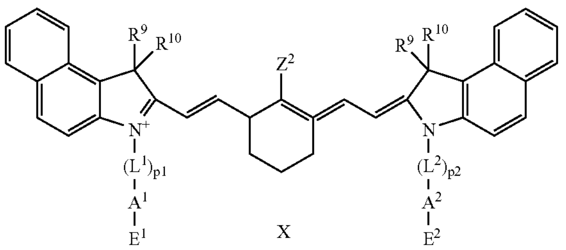

(XIV)

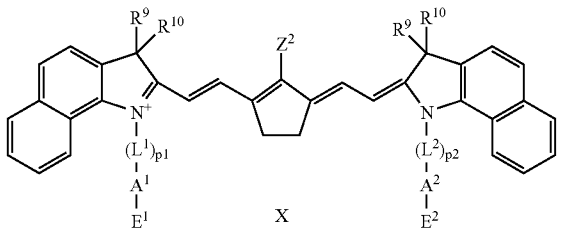

(XV)

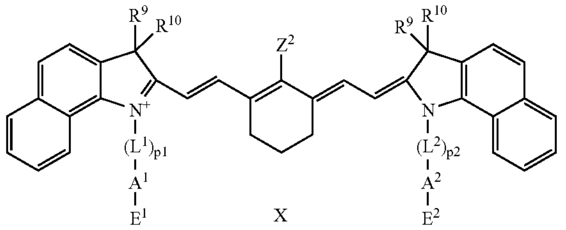

In the above formulae, IV–XV, $p_1$, $p_2$, $-L^1-$, $-L^2-$, $-E^1$, $-E^2$, $-A^1-$, $-A^2-$, $—Y^1—$, $—Y^2—$, $R^1$ to $R^{11}$, $Z^2$ and X have the same meaning as in formula III above.

Other preferred subclasses of IR light absorbing dyes are represented by formula III in which the perfluoroalkyl group is covalently linked to the dye and/or comprised in the counter ion X, if a counter ion X is present. The indices/substituents $p_1$, $p_2$, $-L^1-$, $-L^2-$, $-E^1$, $-E^2$, $-A^1-$, $-A^2-$, $—Y^1—$, $—Y^2—$, $R^1$ to $R^{11}$, $Z^1$, $Z^2$, $Z^3$ and X have the same meaning as in formula III above.

Other preferred subclasses are represented by IR light absorbing dyes which contain one or more perfluoroalkyl groups comprising at least 6 fluorine atoms. The perfluoroalkyl group can be covalently linked to the dye and/or comprised in the counter ion X.

Additional preferred subclasses of IR light absorbing dyes are represented by formula III in which the perfluoroalkyl group is not covalently linked to the dye but comprised in the counter ion X. The indices/substituents $p_1$, $p_2$, $-L^1-$, $-L^2-$, $-E^1$, $-E^2$, $-A^1-$, $-A^2-$, $—Y^1—$, $—Y^2—$, $R^1$ to $R^{11}$, $Z^1$, $Z^2$, $Z^3$ and X have the same meaning as in formula III above with the proviso that:

$-A^1-$, $-A^2-$, $R^1$ to $R^{11}$ can not represent a perfluoroalkyl group

X contains a perfluoroalkyl group which contains at least 6 fluorine atoms

Further preferred subclasses of IR light absorbing dyes are represented by formulae XVI to XXI:

(XVI)

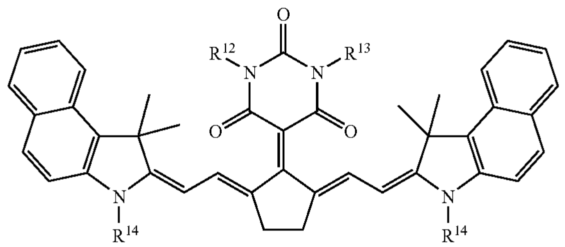

(XVII)

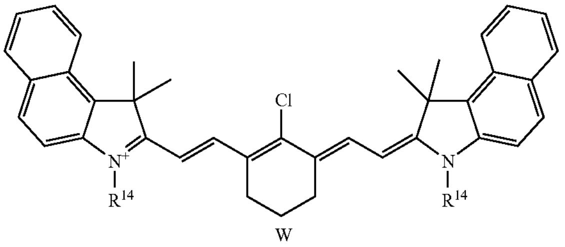

(XVIII)

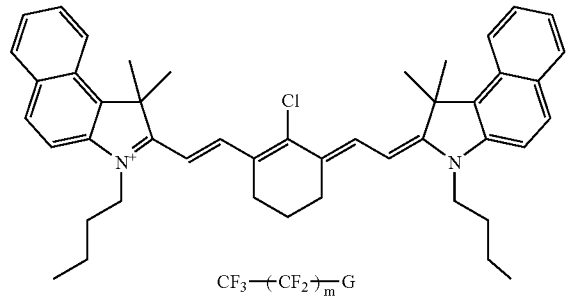

(XIX)

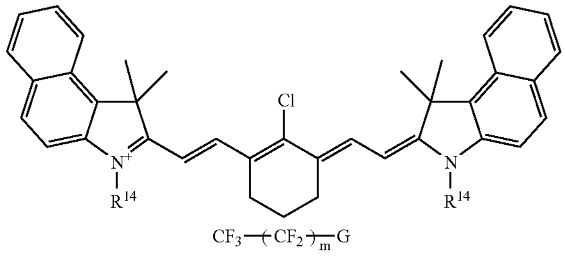

(XX)

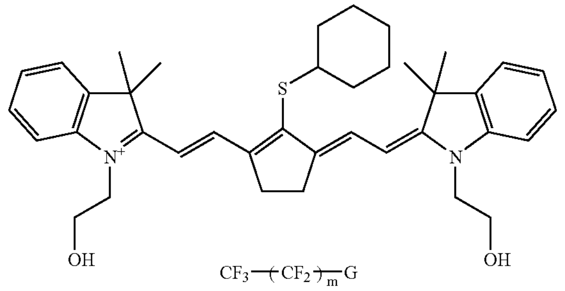

-continued (XXI)

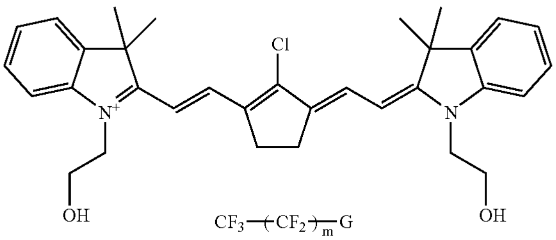

$CF_3-(CF_2)_m-G$ wherein m is 2 or an integer greater than 2;

$R^{12}$ and $R^{13}$ independently represent a hydrogen atom, an optionally substituted alkyl, alkenyl, aryl or aralkyl group or a perfluoroalkyl group which may optionally comprise a terminal group E defined as $-E^1$ and $-E^2$ above;

$R^{14}$ represents $-(CH_2)_2-OCO-(CH_2)_2-(CF_2)_k-CF_3$;

with k is 2 or an integer greater than 2;

W represents $Cl^-$, $Br^-$, $I^-$, $F^-$, $ClO_4^-$, $BF_4^-$;

G represents $SO3^-$, $SO4^-$ or $COO^-$.

Specific examples of IR absorbing dyes that are preferred for use in this invention include the following compounds:

(IR-1)

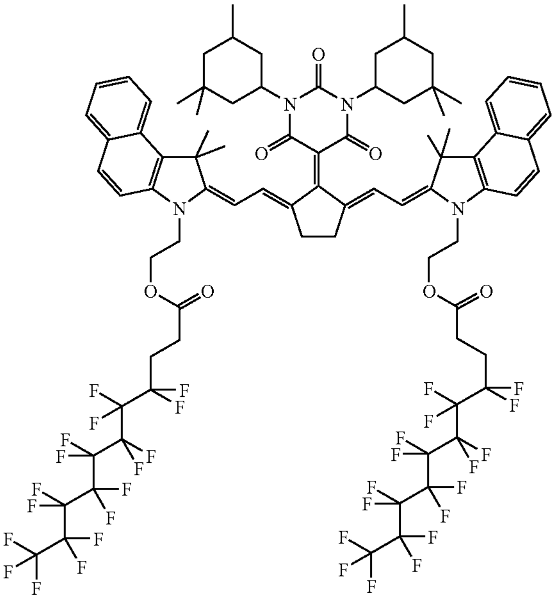

-continued (IR-2)

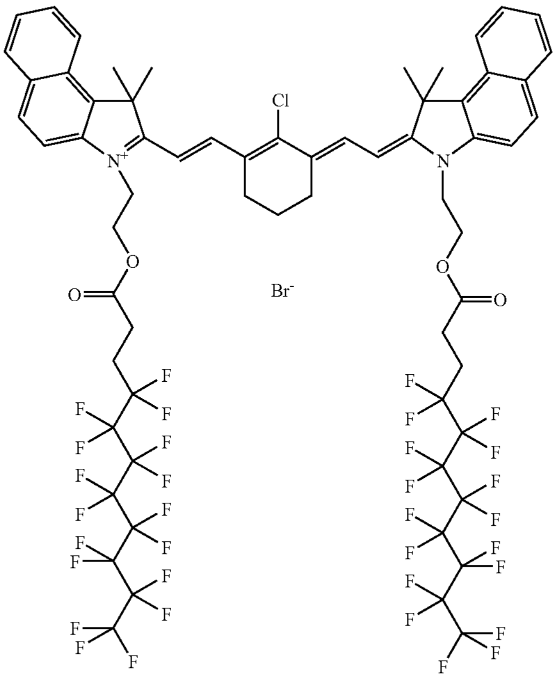

(IR-3)

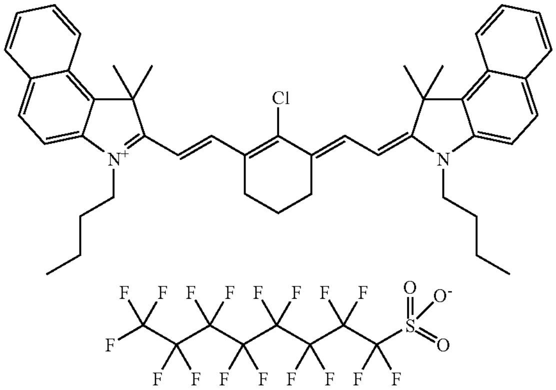

(IR-4)

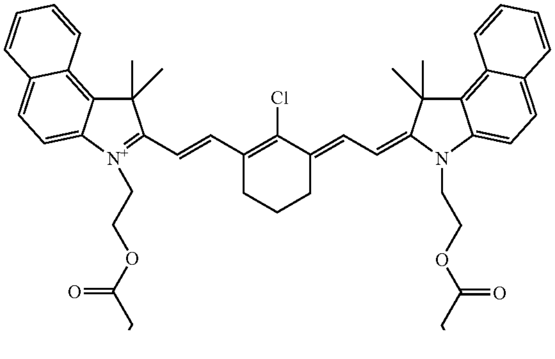

-continued

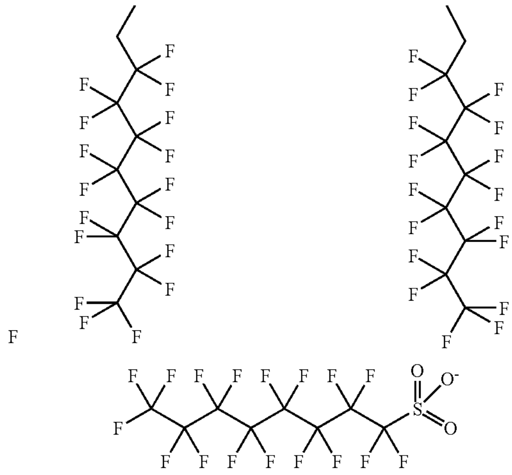

(IR-5)

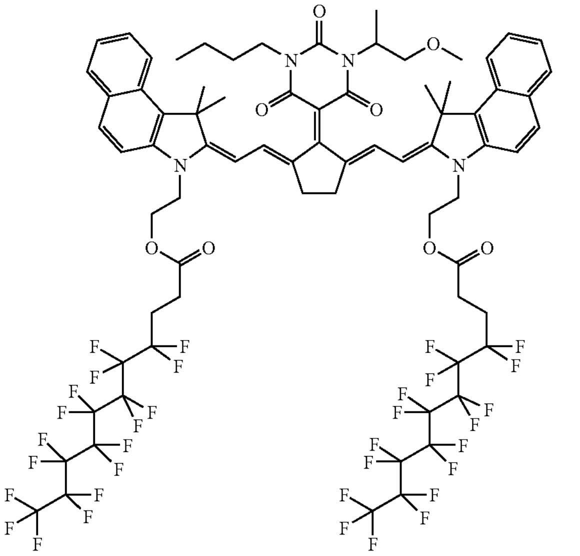

(IR-6)

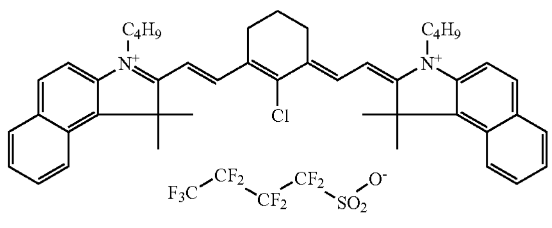

-continued (IR-7)

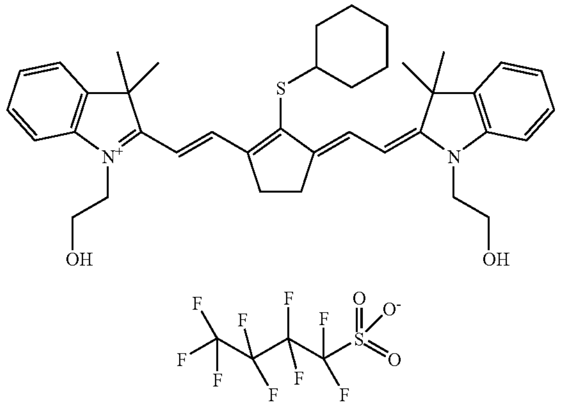

(IR-8)

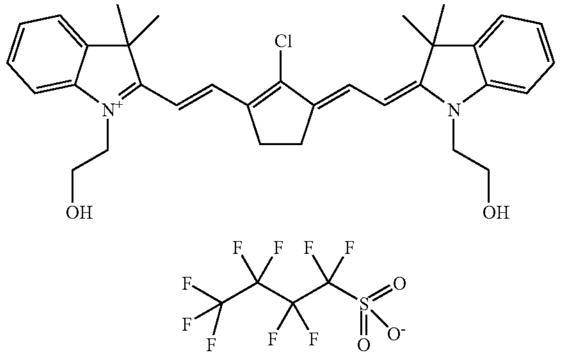

In an embodiment the infrared light absorbing dye is selected from the group consisting of squaryliunz croconate, merocyanine, cyanine, indolizine, pyrilium and metal dithioline dyes.

Next to the preferred infrared dyes containing a perfluoroalkyl group, the coating can contain additional infrared absorbing dyes such as cyanine dyes or pigments such as carbon black. Examples of suitable IR absorbers are described in e.g. EP-A 823327, EP-A 978376, EP-A 1029667, EP-A 1053868, EP-A 1093934; WO 97/39894 and WO 00/29214.

The first layer may further contain other ingredients such as additional binders to improve the run length of the plate, colorants, development inhibitors as disclosed in WO 97/39894 and EP-A 823 327 or accelerators such as 3,4,5-trimethoxybenzoic acid. Said colorants are preferably dyes which during development remain in the coating at non-exposed areas and which are washed out at exposed areas, thereby producing a visible image. Such indicator dyes preferably do not sensitize the coating to visible light.

Suitable development accelerators are described in e.g. EP-A 933682. Such compounds act as dissolution promoters because they are capable of reducing the dissolution time of the first layer. For example, cyclic acid anhydrides, phenols or organic acids can be used in order to improve the aqueous developability. Examples of the cyclic acid anhydride include phtalic anhydride, tetrahydrophtalic anhydride, hexahydrophtalic anhydride, 3,6-endoxy 4-tertrahydrophalic anhydride, tetrachlorophtalic anhydride, maleic anhydride, chloromaleic anhydride, alpha-phenylmaleic anhydride, succinic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxyphenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-888,942 and 2-96,755. Specific examples of these organic acids include p-toluenesulfonic acid, dodecylbenzenesylfonic acid, p-tolenesulfinic acid, ethylsulfuric acid, phenylphosphonic acid, phenylphosphinic acid, phenyl phosphate, diphenyl phosphate, benzoic acid, isophtalic acid, adipic acid, p-toluic acid, 3,4-dimethylmethoxybenzoic acid, phtalic acid, terephtalic acid, 4-cyclohexene-1,2-dicarboxylic acid, erucic acid, lauric acid, n-undecanoic acid, and ascorbic acid. The amount of the cyclic acid anhydride, phenol, or organic acid contained in the image forming composition is preferably in the range of 0.05 to 20% by weight.

The support has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 $mg/m^2$ and 750 $mg/m^2$. Further, the ratio of silica to hydrophilic binder is preferably more than 1 and the surface area of the colloidal silica is preferably at least 300 $m^2$/gram, more preferably at least 500 $m^2$/gram.

The printing plate precursor of the present invention can be exposed to light, e.g. by means of LEDs or a laser head. Preferably, one or more lasers or a laser diode are used. The light used for the exposure is infrared light having a wavelength in the range from about 750 to about 1500 nm and preferably a laser such as a semiconductor laser diode, a Nd:YAG or a Nd:YLF laser is used. The required laser power depends on the sensitivity of the image-recording layer, the pixel dwell time of the laser beam, which is determined by the spot diameter (typical value of modern plate-setters at $1/e^2$ of maximum intensity: 10–25 μm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N.V.) is a typical example of a plate-setter using the ITD-technology. XTD plate-setters operate at a lower scan speed typically from 0.1 m/sec to 20 m/sec and have a typical laser-output-power per beam from 20 mW up to 500 mW. The Creo Trendsetter plate-setter family (trademark of Creo) and the Agfa Excalibur plate-setter family (trademark of Agfa Gevaert N.V.) both make use of the XTD-technology.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-exposed areas of the coating are removed by immersion in an aqueous alkaline developer, which may be combined with mechanical rubbing, e.g. by a rotating brush. The development step may be followed by a drying step, a rinsing step, a gumming step, and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid inks which are suitable for use in the method of the present invention have been described in U.S. Pat. No. 4,045,232 and U.S. Pat. No. 4,981,517. In a most preferred embodiment, the single-fluid ink comprises an ink phase, also called the hydrophobic or oleophilic phase, and a polyol phase as described in WO 00/32705.

EXAMPLES

Synthesis of the IR Light Absorbing Dyes

Synthesis of IR-1

Product 1+product 2+product 3→IR-1

Product 1

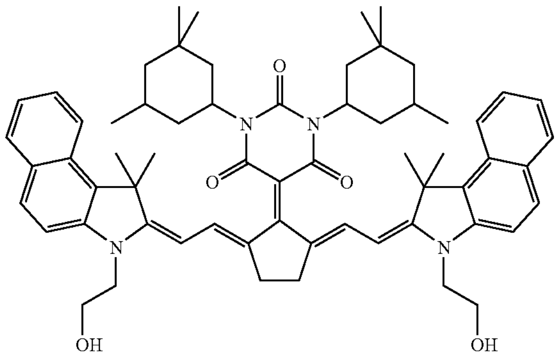

Product 2

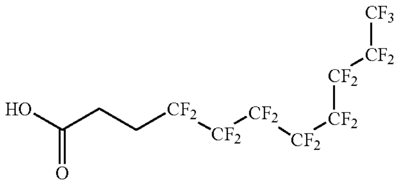

3 mol of product 2 is dissolved in 5 l methyl ethyl ketone and 6 l toluene. 8 l of solvent is separated by distillation and subsequently 3 mol of 1,1'-carbonyldiimidazole (product 3) and 1 mol of product 1 are added and stirred at 100° C. for 30 minutes. Adding acetone and methanol precipitates the product. (Yield=78%)

Synthesis of Intermediate Product 1

Product 4+product 5→product 1

Product 4

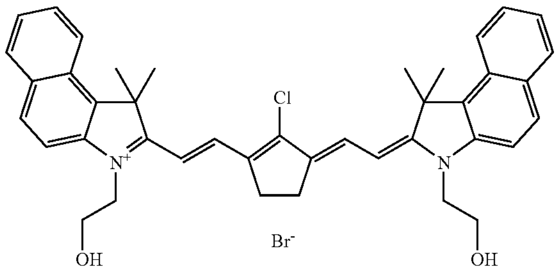

Product 5

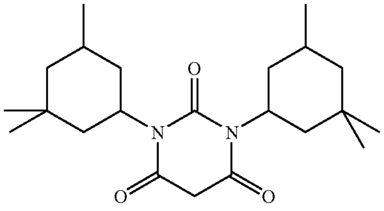

In a mixture of 8 l methanol and 4 l methylene chloride, 1 mol of product 4, 1 mol of product 5 and 1.5 mol of potassium acetate are stirred for three hours at room temperature. Adding methyl ethyl ketone precipitates the product. Product 1 is separated by filtration, washed with water and dried. (Yield: 67%)

Synthesis of Intermediate Product 4

Product 6+product 7→product 4

Product 6

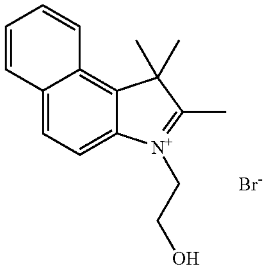

Product 7

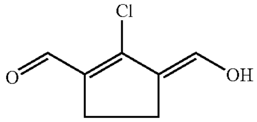

To a mixture of 2 l methanol and 0.25 l triethylamine, 2 mol of product 6, 1 mol of product 7 and 0.2 l acetic acid anhydride are added and stirred for two hours at 60° C. Product 4 is filtered and dried. (Yield: 40%)

Synthesis of Intermediate Product 6

Product 8+product 9→product 6

Product 8

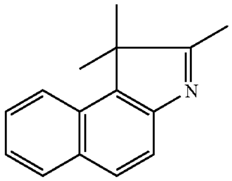

1 mol of product 8 and 1.1 mol of 2-bromoethanol (product 9) are stirred during four hours at 100° C. in 2 l sulfolane. Adding acetone precipitates the product. Product 6 is filtered and dried. (Yield=85%)

Synthesis of Intermediate Product 7

10 mol of dimethylformamide and 3 mol phosphoryl chloride are heated up to 65° C.; subsequently 1 mol of cyclopentanon is dropped to this mixture. After one hour of stirring at 60° C. the reaction mixture is poured into 2 l water containing 7 mol sodium acetate. Product 7 is filtered and dried. (Yield=60%)

Synthesis of Intermediate Product 5

Product 12+product 13→product 5

Product 12

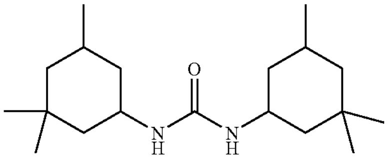

1 mol of product 12, 1.05 mol malonic acid (product 13), 0.5 l toluene, 0.18 l acetic acid and 0.25 l acetic acid anhydride are stirred for 2.5 hours at 100° C. After pouring the reaction mixture into a methanol/water mixture, product 5 is filtered and dried. (Yield=44%)

Synthesis of intermediate product 12

Product 14+product 3→product 12

Product 14

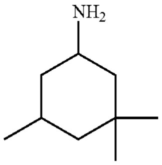

2 mol of product 14 and 1 mol of 1,1'-carbonyldiimidazole (product 3) are stirred at 90° C. for 30 minutes. After pouring the reaction mixture into a methanol/water mixture, product 12 is filtered and dried. (Yield 28%)

Synthesis of IR-2

Product 15+product 2+product 3→IR-2

Product 15

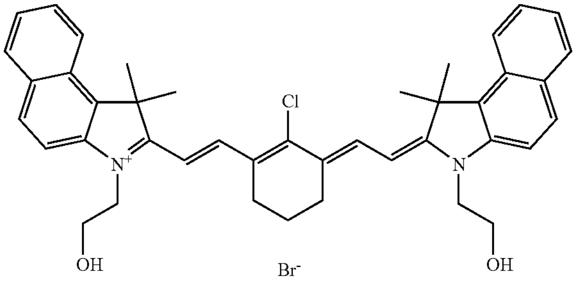

3 mol of product 2, 1 l methyl ethyl ketone, 5 l toluene are mixed and about 4 l is separated by distillation. 3 mol of 1,1'-carbonyldiimidazole (product 3) and 1 mol of product 15 are added and stirred at 100° C. for 30 minutes. Adding 8 l ethyl acetate precipitates the product. IR-2 is filtered and dried. (Yield=85%)

Synthesis of Intermediate Product 15

Product 6+product 16→product 15

Product 16

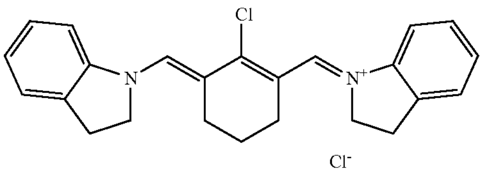

1 mol of product 16, 2 mol of product 6, 2 mol triethylamine and 1.6 mol acetic acid are stirred at 50° C. for 45 minutes. Adding ethyl acetate precipitates the product. Product 15 is filtered and dried. (Yield=93%)

Synthesis of Intermediate Product 16

0.8 l of N,N dimethylformamide and 3 mol of phosphoryl chloride are mixed and heated to 60° C., subsequently 1 mol cyclohexanone is dropped to this mixture and the mixture is stirred at 60° C. for four hours. The mixture is poured into 4 l water containing 8 mol sodium acetate. The precipitated product is filtered and added to a mixture of 1.5 l acetone and 0.5 l water. 2.1 mol indole and 2.3 mol concentrated acid chloride are added and the mixture is stirred for four hours at room temperature. Product 16 is filtered and dried. (Yield: 68%)

Synthesis of IR-3

Product 19+product 20→IR-3

Product 19

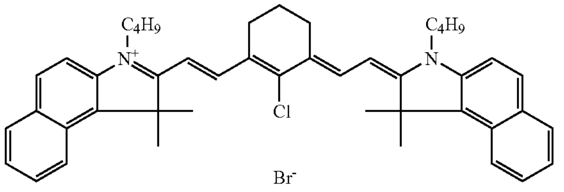

Product 20

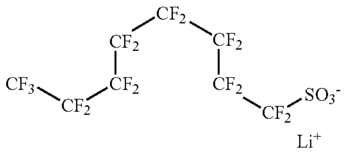

1 mol of product 19, 1.2 mol of product 20 and 16 l methanol are stirred at room temperature for one hour. IR-3 is filtered and dried. (Yield: 71%)

Synthesis of Intermediate Product 19

Product 21+product 22→product 19

Product 21

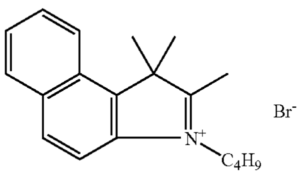

Product 22

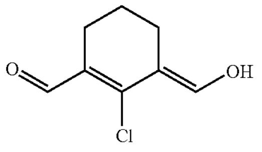

1 mol of product 22, 2 mol of product 21, 2 l acetic acid, 3 mol triethylamine and 1 l actetic acid anhydride are mixed and stirred at 60° C. for two hours. Product 19 is filtered and dried. (Yield: 57%)

Synthesis of Intermediate Product 21

1 mol of product 8 and 2 mol n-butyl bromide are stirred in 0.5 l sulfolane for four hours at 100° C. Product 21 is filtered, washed with ethyl acetate and dried. (Yield: 61%)

Synthesis of Intermediate Product 22

0.8 l N,N dimethylformamide and 3 mol phosphoryl chloride are mixed and heated to 60° C., subsequently 1 equivalent cyclohexanone is dropped to this mixture and the mixture is stirred at 60° C. for four hours. The mixture is poured into 4 l water containing 8 mol sodium acetate. The precipitated product 22 is filtered and dried.

Synthesis of IR-4

Product 24+product 2+product 3→IR-4 product 24

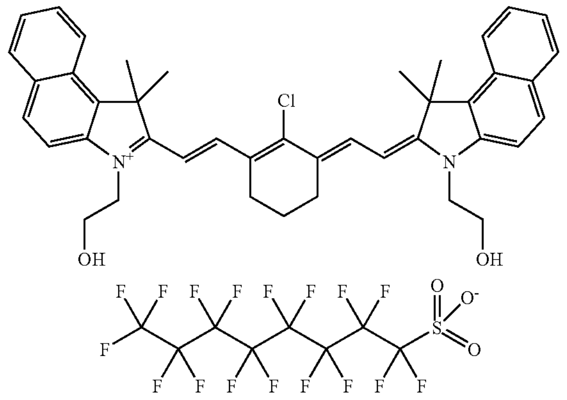

3 mol of product 2 is dissolved in 5 l methyl ethyl ketone and 15 l toluene; about 10 l solvent is separated by distillation and subsequently 3 mol 1,1'-carbonyldiimidazole (product 3) and 1 mol of product 24 are added and stirred at 90° C. for 15 minutes. The reaction mixture is poured into methanol, and IR-4 is filtered and dried. (yield: 45%)

Synthesis of Intermediate Product 24

1 mol of product 15 and 1.2 mol of product 20 are dissolved in 1 l methanol and 1 l methylene chloride. The mixture is stirred at room temperature for 30 minutes. After stirring, methylene chloride is evaporated and replaced by methanol. Product 24 is filtered and dried. (Yield=69%)

IR -COMP1

Commercial product; CASRN 134127-48-3

IR-COMP1

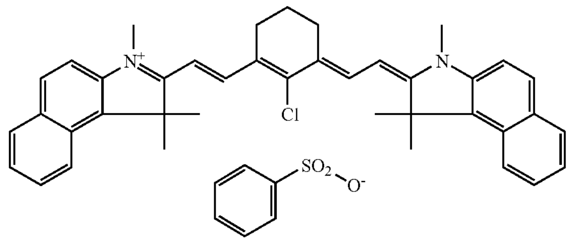

Synthesis of IR-COMP2

Product 25+product 5→IR -COMP2

Product 25

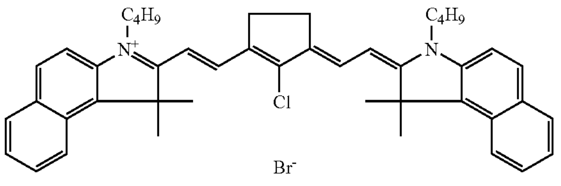

IR-COMP2

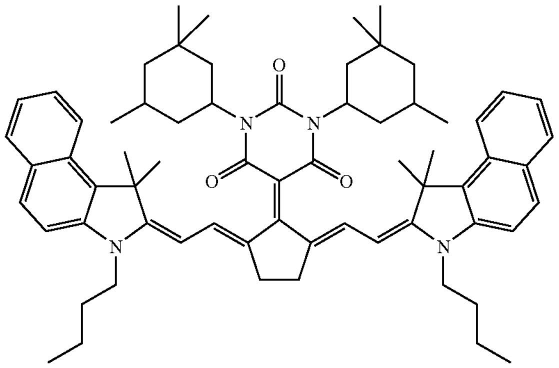

1 mol of product 25 and 1 mol of product 5 are dissolved in 15 l methanol and 7 l methylene chloride. 2 mol potassium acetate is added and the mixture is stirred for 3 hours at 40° C. After evaporation of methylene chloride, COMP-2 is filtered and dried. (Yield 46%)

Synthesis of Intermediate Product 25

Product 21+product 26→product 25

Product 26

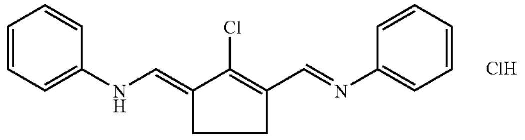

1 mol of product 26 and 2 mol of product 21 are added to 2 l acetic acid anhydride and 2.2 mol triethylamine. The mixture is stirred for 2 hours at room temperature. After stirring 40 l ethyl acetate is added and product 25 is filtered and dried. (Yield=30%)

Synthesis of Intermediate Product 26

Product 7+product 27→product 26

Product 27

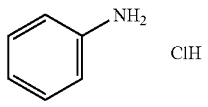

1 mol of product 7 and 2 mol of product 27 are dissolved in 5 l acetone and 2 l water and stirred for one hour at room temperature. Product 26 is filtered and dried. (Yield=80%)

Examples 1 to 6

These examples demonstrate the use of infrared dyes which contain a perfluoroalkyl group in a coating according to the present invention in which the water repellent-compound is a polysiloxane containing polymer.

Preparation of the Support

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 μm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$ then washed with demineralized water, post-treated with a solution containing polyvinylphosphonic acid and subsequently with a solution containing aluminum trichloride, rinsed with demineralized water at 20° C. during 120 seconds and dried.

Plate Precursor Materials

The solutions in Table 1 below were coated on the above support at a wet coating thickness of 20 μm and dried for 1 minute at 130° C. The materials were then imaged on a Creo Trendsetter 3244 (830 nm) using different energy density settings (intensity at the image plane) in the range from 80 $mJ/cm^2$ up to 200 $mJ/cm^2$. The plates were then processed by dipping for 60 seconds in a development tank filled with DP300 (aqueous alkaline developer commercially available from Agfa) at a temperature of 25° C. The IR-sensitivity of the different compositions corresponds to the minimum energy density setting that is required to obtain a 50% reduction of the light absorption of the coating, measured on the developed plate at the wavelength maximum of the contrast dye, in areas which have been exposed with a dot area of a 50% screen (@200 lpi).

The results in Table 1 indicate that the coatings which comprise an infrared dye containing a perfluoralkyl group provide a higher sensitivity than the comparative coatings in which the corresponding infrared dyes do not contain a perfluoroalkyl group.

TABLE 1

| Ingredients (g) | Ex. 1 (inv.) | Ex. 2 (inv.) | Ex. 3 (inv.) | Ex. 4 (inv.) | Ex. 5 (comp.) | Ex. 6 (comp.) |
|---|---|---|---|---|---|---|
| Tetrahydrofuran | 25.76 | 25.76 | 25.76 | 25.76 | 25.76 | 25.76 |
| Alnovol SPN452* | 6.59 | 6.59 | 6.59 | 6.59 | 6.59 | 6.59 |
| Methoxypropanol | 16.98 | 16.98 | 16.98 | 16.98 | 16.98 | 16.98 |
| IR-1 | 0.1 | — | — | — | — | — |
| IR-2 | — | 0.1 | — | — | — | — |
| IR-3 | — | — | 0.1 | — | — | — |
| IR-4 | — | — | — | 0.1 | — | — |
| IR-COMP1 | — | — | — | — | 0.1 | — |
| IR-COMP2 | — | — | — | — | — | 0.1 |
| Flexo blau 630** | 0.03 | 0.03 | 0.03 | 0.03 | 0.03 | 0.03 |
| Tego Glide 410*** | 0.14 | 0.14 | 0.14 | 0.14 | 0.14 | 0.14 |
| Tego Wet 265**** | 0.05 | 0.05 | 0.05 | 0.05 | 0.05 | 0.05 |

TABLE 1-continued

| Ingredients (g) | Ex. 1 (inv.) | Ex. 2 (inv.) | Ex. 3 (inv.) | Ex. 4 (inv.) | Ex. 5 (comp.) | Ex. 6 (comp.) |
|---|---|---|---|---|---|---|
| 2,3,4-trimethoxy-benzoic acid | 0.36 | 0.36 | 0.36 | 0.36 | 0.36 | 0.36 |
| IR sensitivity ($mJ/cm^2$) | 120 | 90 | 120 | 80 | >200 | >200 |

*Alnovol SPN452 is a 40.5% solution in Dowanol PM (commercially available from Clariant)
**Triaryl methane dye commercially available from BASF
***a polymer containing polysiloxane commercially available from Tego Chemie, Essen, Germany; 10 wt. % solution in methoxypropanol.
****a polymer containing polysiloxane commercially available from Tego Chemie, Essen, Germany; 10 wt. % solution in methoxypropanol.

Examples 7 to 12

These examples demonstrate the use of infrared dyes which contain a perfluoroalkyl group in a coating according to the present invention in which the water repellent-compound is a perfluoroalkyl containing polymer.

Preparation of the Support

The support was prepared as described in examples 1 to 6.

Plate Precursor Materials

The solutions in Table 2 below were coated on the above support at a wet coating thickness of 20 μm and dries for 1 minute at 130° C. The materials were then imaged on a Creo Trendsetter 3244 (830 nm) using different energy density settings (intensity at the image plane) in the range from 80 $mJ/cm^2$ up to 200 $mJ/cm^2$. The plates were then processed by dipping for 60 seconds in a development tank filled with DP300 (aqueous alkaline developer commercially available from Agfa) at a temperature of 25° C. The IR-sensitivity of the different compositions corresponds to the minimum energy density setting that is required to obtain a 50% reduction of the light absorption of the coating, measured on the developed plate at the wavelength maximum of the contrast dye, in areas which have been exposed with a dot area of a 50% screen (@200 lpi).

The results in Table 2 indicate that the coatings which comprise an infrared dye containing a perfluoralkyl group provide a higher sensitivity than the comparative coatings in which the corresponding infrared dyes do not contain a perfluoroalkyl group.

TABLE 2

| Ingredients (g) | Ex. 7 (inv.) | Ex. 8 (inv.) | Ex. 9 (inv.) | Ex. 10 (inv.) | Ex. 11 (comp.) | Ex. 12 (comp.) |
|---|---|---|---|---|---|---|
| Tetrahydrofuran | 25.76 | 25.76 | 25.76 | 25.76 | 25.76 | 25.76 |
| Alnovol SPN452* | 6.59 | 6.59 | 6.59 | 6.59 | 6.59 | 6.59 |
| Methoxypropanol | 16.98 | 16.98 | 16.98 | 16.98 | 16.98 | 16.98 |
| IR-1 | 0.1 | — | — | — | — | — |
| IR-2 | — | 0.1 | — | — | — | — |
| IR-3 | — | — | 0.1 | — | — | — |
| IR-4 | — | — | — | 0.1 | — | — |
| IR-COMP1 | — | — | — | — | 0.1 | — |
| IR-COMP2 | — | — | — | — | — | 0.1 |
| Flexo blau 630** | 0.03 | 0.03 | 0.03 | 0.03 | 0.03 | 0.03 |
| Fluorad FC431*** | 0.14 | 0.14 | 0.14 | 0.14 | 0.14 | 0.14 |
| 2,3,4-trimethoxy-benzoic acid | 0.36 | 0.36 | 0.36 | 0.36 | 0.36 | 0.36 |

TABLE 2-continued

| Ingredients (g) | Ex. 7 (inv.) | Ex. 8 (inv.) | Ex. 9 (inv.) | Ex. 10 (inv.) | Ex. 11 (comp.) | Ex. 12 (comp.) |
|---|---|---|---|---|---|---|
| IR sensitivity ($mJ/cm^2$) | 100 | 80 | 120 | 80 | >200 | >200 |

*Alnovol SPN452 is a 40.5% solution in Dowanol PM (commercially available from Clariant)
**Triaryl methane dye commercially available from BASF
***a polymer containing perfluoroalkyl commercially available from 3M; 10 wt. % solution in methoxypropanol.

The invention claimed is:

1. A heat-sensitive lithographic printing plate precursor comprising a support having a hydrophilic surface and a coating provided on the hydrophilic surface, said coating comprising in the order given a first layer containing an oleophilic resin soluble in an aqueous alkaline developer and a second layer capable of preventing the developer from penetrating into the first layer at unexposed areas, said second layer comprising a water-repellent compound selected from the group consisting of a polymer comprising siloxane and/or perfluoroalkyl monomeric units, and a block- or graft-copolymer comprising a poly- or oligo (alkylene oxide) and a block of poly- or oligosiloxane and/or perfluoroalkyl units and wherein the alkali-solubility of said coating increases on heating and said coating comprises an infrared light absorbing dye comprising at least one perfluoroalkyl group, wherein the infrared light absorbing dye carries a charge and at least one perfluoroalkyl group is included in a counter ion and contains at least 6 fluorine atoms.

2. The heat-sensitive lithographic printing plate precursor according to claim 1 wherein the infrared light absorbing dye further comprises at least one covalently bonded perfluoroalkyl group.

3. The heat sensitive lithographic printing plate precursor according to claim 2 wherein the amount of the water-repellent compound in the coating is between 0.5 and 15 $mg/m^2$.

4. The heat sensitive lithographic printing plate precursor according to claim 2 wherein the second layer consists essentially of the water-repellent compound and the infrared light absorbing dye.

5. The heat sensitive lithographic printing plate precursor according to claim 2 wherein the infrared light absorbing dye corresponds to the following formula:

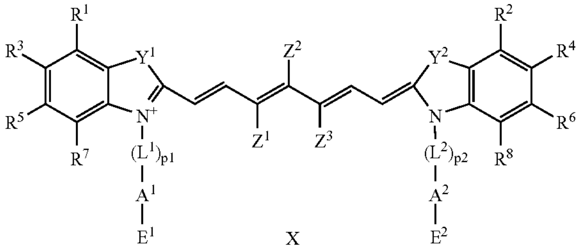

X wherein $-L^1-$ and $-L^2-$independently represent a divalent linking;

$-E^1$ and $-E^2$independently represent a neutral, anionic or cationic terminal group selected from alkyl, —OH, —H, —Cl, —Br, —F (neutral groups);

$—SO_3^-$, $—SO_4^-$, $—PO_3^{2-}$, $—COO^-$ (anionic groups);

$—[NR^aR^bR^c]^+$ (cationic group);

$R^a$, $R^b$ and $R^c$ independently represent a hydrogen atom or an alkyl group;

$-A^1-$ and $—A^2-$independently represent $—C_vF_{2v}—$, $—[(CF_2)_2]_w—$, a long chain alkylene group containing at least four carbon atoms, or an optionally substituted alkylene, alkenylene, arylene or aralkylene group;

with $p_1$ and $p_2$ are 0 or 1;

with v and w are 2 or an integer greater than 2;

$—Y^1—$ and $—Y^2—$ independently represent $—CR^9R^{10}—$, —S—, —Se—, $—NR^{11}—$, —CH═CH— or —O—;

$R^1$ to $R^{11}$ each independently represent a hydrogen atom, an optionally substituted alkyl, alkenyl, aryl or aralkyl group or a group selected from a halogen atom, $—NO_2$, $—O—R^d$, $—CO—R^d$, $—CO—O—R^d$, $—O—CO—R^d$, $—CO—NR^dR^e$, $—NR^dR^e$, $—NR^d—CO—R^e$, $—NR^d—CO—O—R^e$, $—NR^d—CO—NR^eR^f$, $—SR^d$, $—SO—R^d$, $—SO_2—R^d$, $—SO_2—O—R^d$, $—SO_2NR^dR^e$or a perfloroalkyl group, each of said groups may optionally comprise a terminal group E defined above as $-E^1$ and $-E^2$ and/or wherein two adjacent groups selected from $R^1$, $R^2$, $R^3$, $R^4$, $R^5$, $R^6$, $R^7$, $R^8$, $Y^1$ and $Y^2$ together form an optionally substituted 5- or 6-membered ring;

$R^d$, $R^e$ and $R^f$ independently represent a hydrogen or an optionally substituted alkyl, alkenyl, aryl or aralkyl group;

$Z^1$ and $Z^3$ each independently represent a hydrogen atom, an alkyl group or $Z^1$ and $Z^3$ together represent the necessary atoms to complete an optionally substituted 5- or 6-membered ring;

$Z^2$ represents a substituent selected from a hydrogen atom, an alkyl group, a halogen atom, an amino group, an arylthio group, an alkylthio group, an aryloxy group, an alkoxy group, a barbituric group or a thiobarbituric group, each of said groups being optionally substituted;

X represents one or more counter ions having a total charge so as to make the dye electrically neutral and wherein X comprises a perfluoroalkyl group containing at least 6 fluorine atoms;

with the proviso that at least one of $R^1$ to $R^{11}$ contains a perfluoroalkyl group or at least one of $-A^1-$ and $-A^2-$ contains a $—C_vF_{2v}—$ group or a $—[(CF_2)_2—O]_w—$ group.

6. The heat sensitive lithographic printing plate precursor according to claim 5 wherein, $Z^1$ and $Z^3$ together represent the necessary atoms to complete an optionally substituted 5- or 6-membered ring.

7. The heat sensitive lithographic printing plate precursor according to claim 6, wherein $-Z^1$ and $-Z^3$ together represent $—(CH_2)_2—$ or $—(CH_2)_3—$.

8. The heat sensitive lithographic printing plate precursor according to claim 7 wherein the IR light absorbing dye corresponds to one of the following formulae:

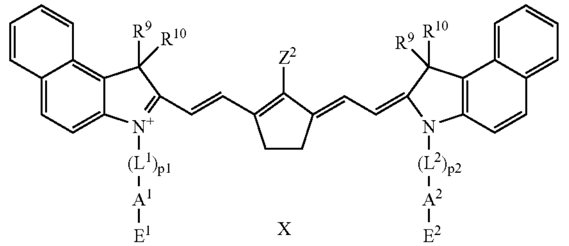

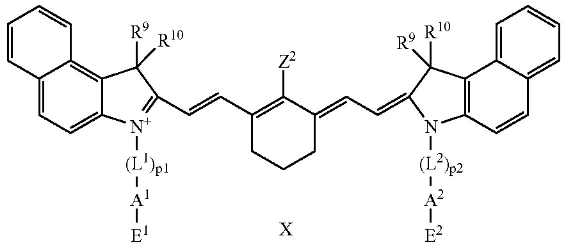

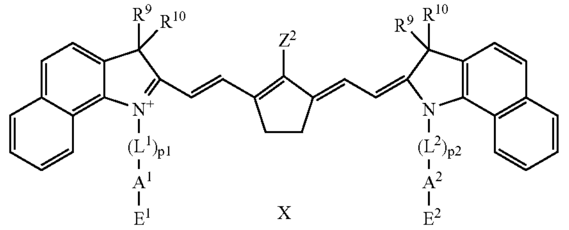

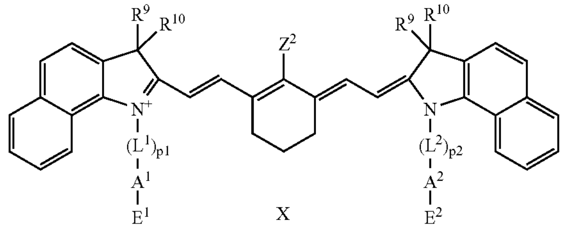

$R^9$ to $R^{10}$ each independently represent a hydrogen atom, an optionally substituted alkyl, alkenyl, aryl or aralkyl group or a group selected from a halogen atom, $—NO_2$, $—O—R^d$, $—CO—R^d$, $—CO—O—R^d$, $—O—CO—R^d$, $—CO—NR^dR^e$, $—NR^dR^e$, $—NR^d—CO—R^e$, $—NR^d—CO—O—R^e$, $—NR^d—CO—NR^eR^f$, $—SR^d$, $—SO—R^d$, $—SO_2—R^d$, $—SO_2—O—R^d$, $—SO_2NR^dR^e$or a perfloroalkyl group, each of said groups may optionally comprise a terminal group E defined above as $-E^1$ and $-E^2$, $R^d$, $R^e$ and $R^f$ independently represent a hydrogen or an optionally substituted alkyl, alkenyl, aryl or aralkyl group.

9. The heat-sensitive lithographic printing plate precursor according to claim 1 wherein the amount of the water-repellent compound in the coating is between 0.5 and 15 $mg/m^2$.

10. The heat sensitive lithographic printing plate precursor according to claim 9 wherein the second layer consists essentially of the water-repellent compound and the infrared light absorbing dye.

11. The heat-sensitive lithographic printing plate precursor according to claim 1 wherein the second layer consists essentially of the water-repellent compound and the infrared light absorbing dye.

12. The heat-sensitive lithographic printing plate precursor according to claim 1 wherein the infrared light absorbing dye corresponds to the following formula:

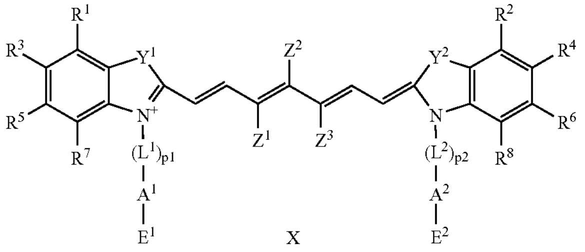

wherein

-$L^1$- and -$L^2$- independently represent a divalent linking;

-$E^1$ and -$E^2$ independently represent a neutral, anionic or cationic terminal group selected from alkyl, —OH, —H, —Cl, —Br, —F (neutral groups);

—$SO_3^-$; —$SO_4^-$, —$PO_3^{2-}$, —$PO_4^{2-}$, —$COO^-$ (anionic groups);

—$[NR^aR^bR^c]^+$ (cationic group);

$R^a$, $R^b$ and $R^c$ independently represent a hydrogen atom or an alkyl group;

-$A^1$- and -$A^2$- independently represent -$C_vF_{2v}$—, —$[(CF_2)_2—O]_w$—, a long chain alkylene group containing at least four carbon atoms, or an optionally substituted alkylene, alkenylene, arylene or aralkylene group;

with $p_1$ and $p_2$ are 0 or 1;

with v and w are 2 or an integer greater than 2;

—$Y^1$— and —$Y^2$— independently represent —$CR^9R^{10}$—, —S—, —Se—, —$NR^{11}$—, —CH=CH— or —O—;

$R^1$ to $R^{11}$ each independently represent a hydrogen atom, an optionally substituted alkyl, alkenyl, aryl or aralkyl group or a group selected from a halogen atom, $NO_2$, —O—$R^d$, —CO—$R^d$, —CO—O—$R^d$, —O—CO—$R^d$, —CO—$NR^dR^e$, $NR^dR^e$, —$NR^d$—CO—$R^e$, —$NR^d$—CO—O—$R^e$, —$NR^d$—CO—$NR^eR^f$, —$SR^d$, —SO—$R^d$, —$SO_2$—$R^d$, —$SO_2$—O—$R^d$, —$SO^2NR^dR^e$ or a perfluoroalkyl group, each of said groups may optionally comprise a terminal group E defined above as -$E^1$ and -$E^2$ and/or wherein two adjacent groups selected from $R^1$, $R^2$, $R^3$, $R^4$, $R^5$, $R^6$, $R^7$, $R^8$, $Y^1$ and $Y^2$ together form an optionally substituted 5- or 6-membered ring;

$R^d$, $R^e$ and $R^f$ independently represent a hydrogen or an optionally substituted alkyl, alkenyl, aryl or aralkyl group;

$Z^1$ and $Z^3$ each independently represent a hydrogen atom, an alkyl group or $Z^1$ and $Z^3$ together represent the necessary atoms to complete an optionally substituted 5- or 6-membered ring;

$Z^2$ represents a substituent selected from a hydrogen atom, an alkyl group, a halogen atom, an amino group, an arylthio group, an alkylthio group, an aryloxy group, an alkoxy group, a barbituric group or a thiobarbituric group, each of said groups being optionally substituted;

X represents one or more counter ions having a total charge so as to make the dye electrically neutral and wherein X comprises a perfluoroalkyl group containing at least 6 fluorine atoms.

13. The heat-sensitive lithographic printing plate precursor according to claim 12 wherein —$Z^1$ and —$Z^3$ together represent the necessary atoms to complete an optionally substituted 5- or 6-membered ring.

14. The heat-sensitive lithographic printing plate precursor according to claim 13 wherein -$Z^1$ and -$Z^3$ together represent —$(CH_2)_2$— or —$(CH_2)_3$—.

15. The heat-sensitive lithographic printing plate precursor according to claim 14 wherein the IR light absorbing dye corresponds to one of the following formulae:

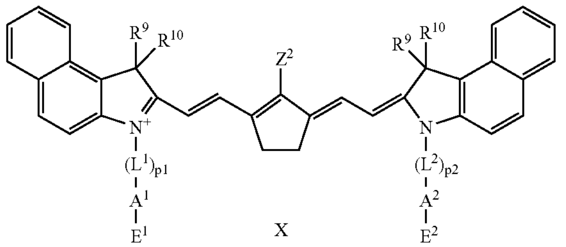

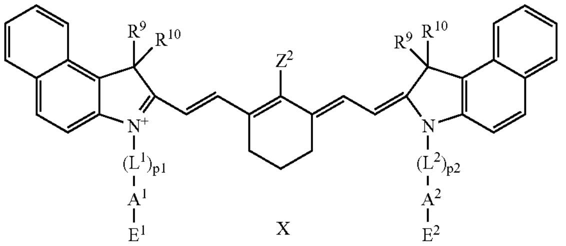

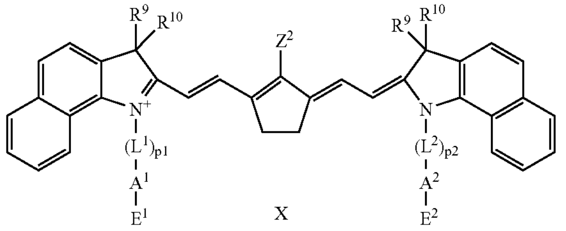

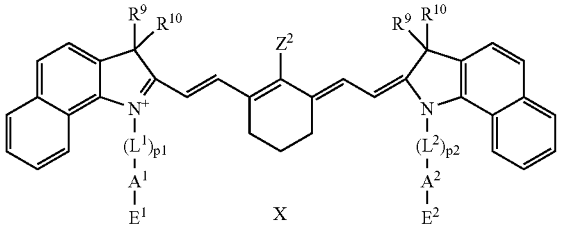

16. The heat-sensitive lithographic printing plate precursor according to claim 14 wherein the IR light absorbing dye corresponds to one of the following formulae:

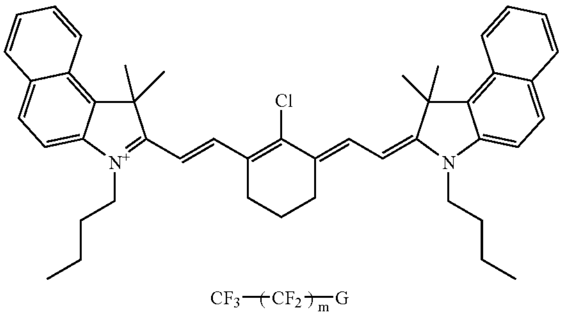
-continued
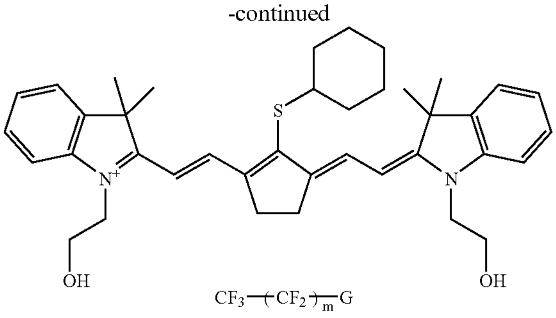
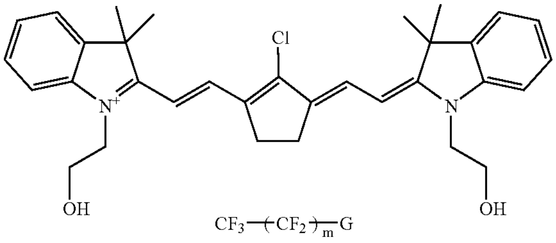
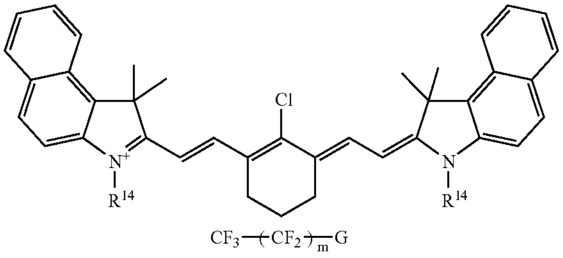
wherein
m is 2 or an integer greater than 2;
$R^{14}$ represents $-(CH_2)_2-OCO-(CH_2)_2-(CF_2)_k-CF_3$;
with k is 2 or an integer greater than 2; and
G represents $SO_3^-$, $SO_4^-$ or $COO^-$.
* * * * *